US009471128B2

(12) United States Patent
Woolf

(10) Patent No.: US 9,471,128 B2
(45) Date of Patent: Oct. 18, 2016

(54) SYSTEMS AND METHODS FOR DISPLAYING, IN A USER INTERFACE, AN ENERGY UTILIZATION METRIC, A WAKE COUNT, AND A TOTAL AMOUNT OF TIME THAT A CPU IS AWAKE

(71) Applicant: Apple Inc., Cupertino, CA (US)

(72) Inventor: Chad B. Woolf, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 188 days.

(21) Appl. No.: 14/291,803

(22) Filed: May 30, 2014

(65) Prior Publication Data

US 2015/0346797 A1    Dec. 3, 2015

(51) Int. Cl.
| G06F 1/00 | (2006.01) |
| G06F 1/32 | (2006.01) |
| G01R 21/00 | (2006.01) |
| G06F 11/32 | (2006.01) |
| G06F 11/34 | (2006.01) |
| G06F 11/30 | (2006.01) |

(52) U.S. Cl.
CPC ............. *G06F 1/3206* (2013.01); *G01R 21/00* (2013.01); *G06F 11/3003* (2013.01); *G06F 11/3062* (2013.01); *G06F 11/323* (2013.01); *G06F 11/3423* (2013.01); *G06F 11/3024* (2013.01); *G06F 11/3466* (2013.01); *G06F 2201/865* (2013.01); *G06F 2201/88* (2013.01)

(58) Field of Classification Search
CPC ..................................................... G06F 1/3203
USPC ........................................................ 713/300
See application file for complete search history.

(56) References Cited

U.S. PATENT DOCUMENTS

| 7,487,058 B2* | 2/2009 | Gross et al. ................... 702/113 |
| 7,584,376 B2* | 9/2009 | Finkelstein et al. .......... 713/324 |
| 8,285,340 B2* | 10/2012 | Hackborn et al. ............. 455/567 |
| 8,316,254 B2* | 11/2012 | Kaneko et al. ................ 713/323 |
| 8,515,878 B2* | 8/2013 | Radloff et al. ................ 705/412 |
| 8,818,743 B2* | 8/2014 | Sfaelos ........................... 702/62 |
| 2011/0252261 A1* | 10/2011 | Rhee et al. .................... 713/340 |
| 2011/0301963 A1* | 12/2011 | Diab et al. ..................... 705/1.1 |
| 2013/0110426 A1* | 5/2013 | Van Olst ......................... 702/62 |
| 2014/0007222 A1* | 1/2014 | Qureshi et al. ................. 726/16 |
| 2014/0091635 A1* | 4/2014 | Sugino et al. ................. 307/104 |

* cited by examiner

*Primary Examiner* — Suresh Suryawanshi
(74) *Attorney, Agent, or Firm* — Blakely, Sokoloff, Taylor & Zafman LLP

(57) ABSTRACT

User interfaces are provided that display application energy usage information to a user. Application energy usage information may be displayed as an energy meter user interface that provides derived information (e.g., power and time used to determine energy usage) that is not available through a traditional activity monitor. For example, energy usage information is provided for an application running in isolation, taking into account energy usage based on what the application is doing and not what the rest of the system is doing (e.g., shows CPU wakes in isolation of any other processes). Each of a series of energy bars is presented as an energy utilization metric that includes at least one of a utilization portion and a wake tax portion, combined to represent to represent total energy utilization.

20 Claims, 7 Drawing Sheets

SYSTEMS AND METHODS FOR DISPLAYING, IN A USER INTERFACE, AN ENERGY UTILIZATION METRIC, A WAKE COUNT, AND A TOTAL AMOUNT OF TIME THAT A CPU IS AWAKE

BACKGROUND

Electronic devices, such as computing systems with ever-increasing computing power, are using more power due to things such as faster processors and graphics cards. The central processing unit (CPU), and increasingly the graphics processing unit (GPU), have been major sources of power consumption in computing systems. CPUs in computers, such as desktops and laptops, utilize a large amount of power due to their complexity and speed, and often represent a significant portion of the total power consumed. While various energy-saving features have been implemented in computers, the overall power consumption of high-performance CPUs remains considerable, even when they are idle.

In many applications, the CPU and other components are idle much of the time, so idle power contributes significantly to overall system power usage. The typical CPU often spends a large fraction of time in an idle state where the entire CPU or various components in the CPU do not execute programmed instructions. Modern CPUs include dynamic clock speed adjustments, power gating, and other power control techniques that reduce the power consumption of the CPU when one or more components in the CPU are idled or utilized at less than full capacity. For example, in one operating mode, a CPU with four execution cores executes a series of program instructions with a single CPU core while the remaining cores are idle. The CPU reduces the clock speed of the idle cores, and optionally deactivates the idle cores completely, while the active core consumes more power during execution of the program instructions.

In order to save energy when the CPU is idle, the CPU may be instructed to enter a low-power mode that consumes less power. Each CPU may have different power modes, which may operate by cutting the clock signal and power from idle units inside the CPU. An idle processor is available to be put to sleep and, while in a sleep state, can save most of the energy it would otherwise consume from actively executing. The more units stopped (e.g., by reducing voltage or completely shutting down units), the more energy is saved. However, more time is required for the CPU to "wake up" and be fully operational again.

If more of the energy-saving potential of processor sleep states were realized, end user energy use could be reduced with no apparent sacrifice of functionality or productivity. Thus, effective management of sleep states and energy considerations are important in software application development for application energy performance. For example, the use of parallelization, merging tasks that are difficult to parallelize in a single instruction thread and avoidance of excessive synchronization among threads are strategies that can help reduce the number of sleep state transitions an application triggers. Ineffective management of sleep states can significantly increase an application's energy consumption by waking the CPU from sleep states unnecessarily.

BRIEF DESCRIPTION OF THE DRAWINGS

Some embodiments are illustrated by way of example and not limitation in the figures of the accompanying drawings in which.

DEFINITIONS

Figure 1:
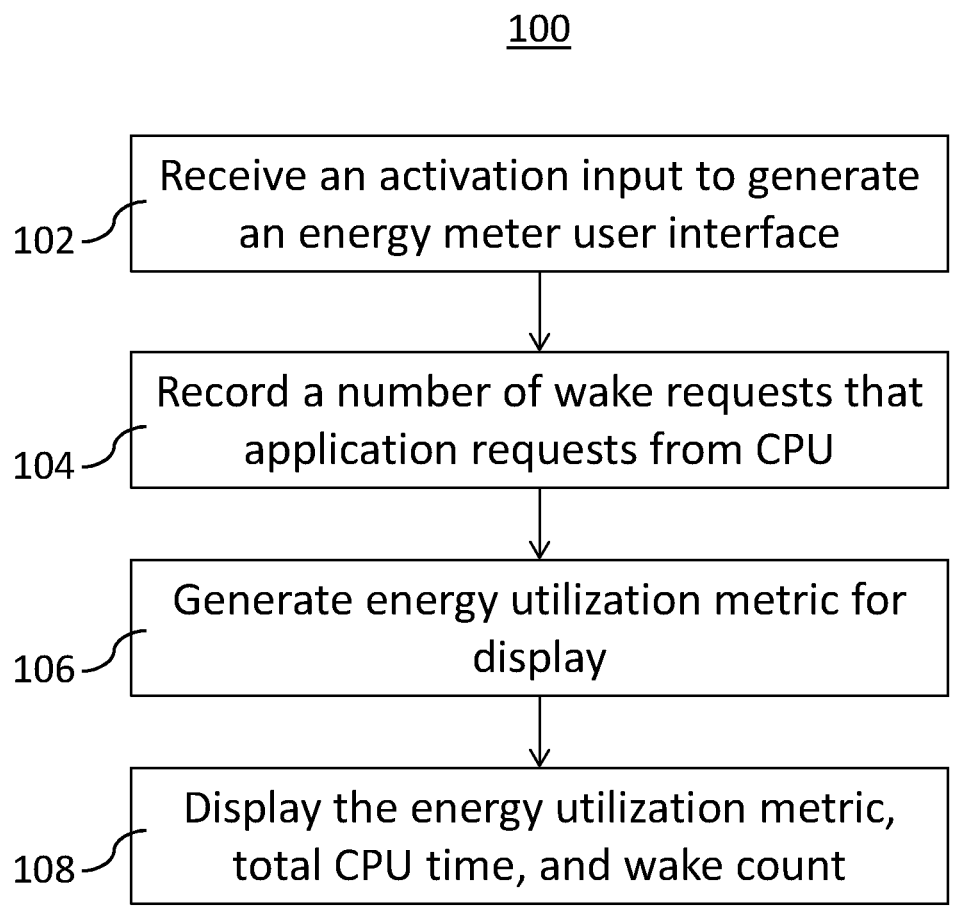
FIG. 1 is a flowchart illustrating a method for generating and displaying an energy meter, according to an example embodiment.

Real-time—For the purposes of this specification and the associated claims, the term "real-time" is used to refer to calculations or operations performed on-the-fly as events occur or input is received by the operable system. However, the use of the term "real-time" is not intended to preclude operations that cause some latency between input and response, so long as the latency is an unintended consequence induced by the performance characteristics of the machine.

Energy meter—For the purposes of this specification and the associated claims, the term "energy meter" is used to refer to a record of any type of the energy consumption for an application including accounting information for the energy consumption of multiple program entities in the software application. A single software application is formed from multiple program entities that include processes, threads, and subroutines. Each process includes one or more execution threads, and each thread executes multiple software routines. The routines form a hierarchy where a parent routine invokes a child sub-routine and the child sub-routine further invokes additional child sub-routines in a recursive manner. The energy accounting data in the energy meter provides a detailed breakdown of the total energy consumption for a particular execution of a software program broken down into pieces that are associated with the individual program entities that are responsible for causing the energy consumption. The energy meter stores energy profiles in a memory for use with profiling software applications that generate human and machine-readable outputs to assist in monitoring, testing, and developing the software program that is executed by displaying the energy meter.

DETAILED DESCRIPTION

The following detailed description refers to the accompanying drawings that depict various details of examples selected to show how particular embodiments may be implemented. The discussion herein addresses various examples of the inventive subject matter at least partially in reference to these drawings and describes the depicted embodiments in sufficient detail to enable those skilled in the art to practice the invention. Many other embodiments may be utilized for practicing the inventive subject matter than the illustrative examples discussed herein, and many structural and operational changes in addition to the alternatives specifically discussed herein may be made without departing from the scope of the inventive subject matter.

In this description, references to "one embodiment" or "an embodiment," or to "one example" or "an example" mean that the feature being referred to is, or may be, included in at least one embodiment or example of the invention. Separate references to "an embodiment" or "one embodiment" or to "one example" or "an example" in this description are not intended to necessarily refer to the same embodiment or example; however, neither are such embodiments mutually exclusive, unless so stated or as will be readily apparent to those of ordinary skill in the art having the benefit of this disclosure. Thus, the present disclosure includes a variety of combinations and/or integrations of the embodiments and examples described herein, as well as further embodiments and examples as defined within the scope of all claims based on this disclosure, as well as all legal equivalents of such claims.

The processes depicted in the figures that follow can be performed by processing logic that comprises hardware (e.g., circuitry, dedicated logic, etc.), software, or a combination of both. Although the processes are described below in terms of some sequential operations, it should be appreciated that some of the operations described may be performed in a different order. Moreover, some operations may be performed in parallel rather than sequentially.

According to various embodiments, user interfaces are provided that display application energy usage information to a user, such as during application development. Application energy usage information may be displayed as an energy meter user interface that provides derived information (e.g., power and time used to determine energy usage) that is not available through a traditional activity monitor. For example, energy usage information is provided for an application running in isolation, taking into account energy usage based on what the application is doing and not what the rest of the system is doing (e.g., shows CPU wakes in isolation of any other processes; for instance, not the number of times the CPU wakes, but instead shows number of times the application requests for the CPU to be woken). When used within an application development environment, such as the X-Code development environment from Apple, Inc., an energy usage meter can provide valuable feedback regarding system resource utilization of an application under development.

FIG. 1 shows a method 100 according to one embodiment for presenting application energy usage information to a user in the context of an energy meter. Examples of user interfaces that can be implemented according to this method are provided in FIGS. 2-6. The method 100 can begin at operation 102 during which an activation input is received to generate an energy meter user interface for display. The method 100 continues at operation 104 by recording a number of wake requests that an application requests to a central processing unit (CPU) as a wake count. In operation 106, an energy utilization metric for the energy meter is generated for display based on an actual amount of CPU usage by the application and a wake tax calculated by comparing time that the CPU is awake to the actual amount of CPU usage by the application. In operation 108, the energy utilization metric, the total amount of time that the CPU is awake, and the wake count is displayed in a user interface for presentation to a user.

Though arranged serially in the example of FIG. 1, other examples may reorder the operations, omit one or more operations, and/or execute two or more operations in parallel using multiple processors or a single processor organized as two or more virtual machines or sub-processors. Moreover, still other examples can implement the operations as one or more specific interconnected hardware or integrated circuit modules with related control and data signals communicated between and through the modules. Thus, any process flow is applicable to software, firmware, hardware, and hybrid implementations.

Figure 2:
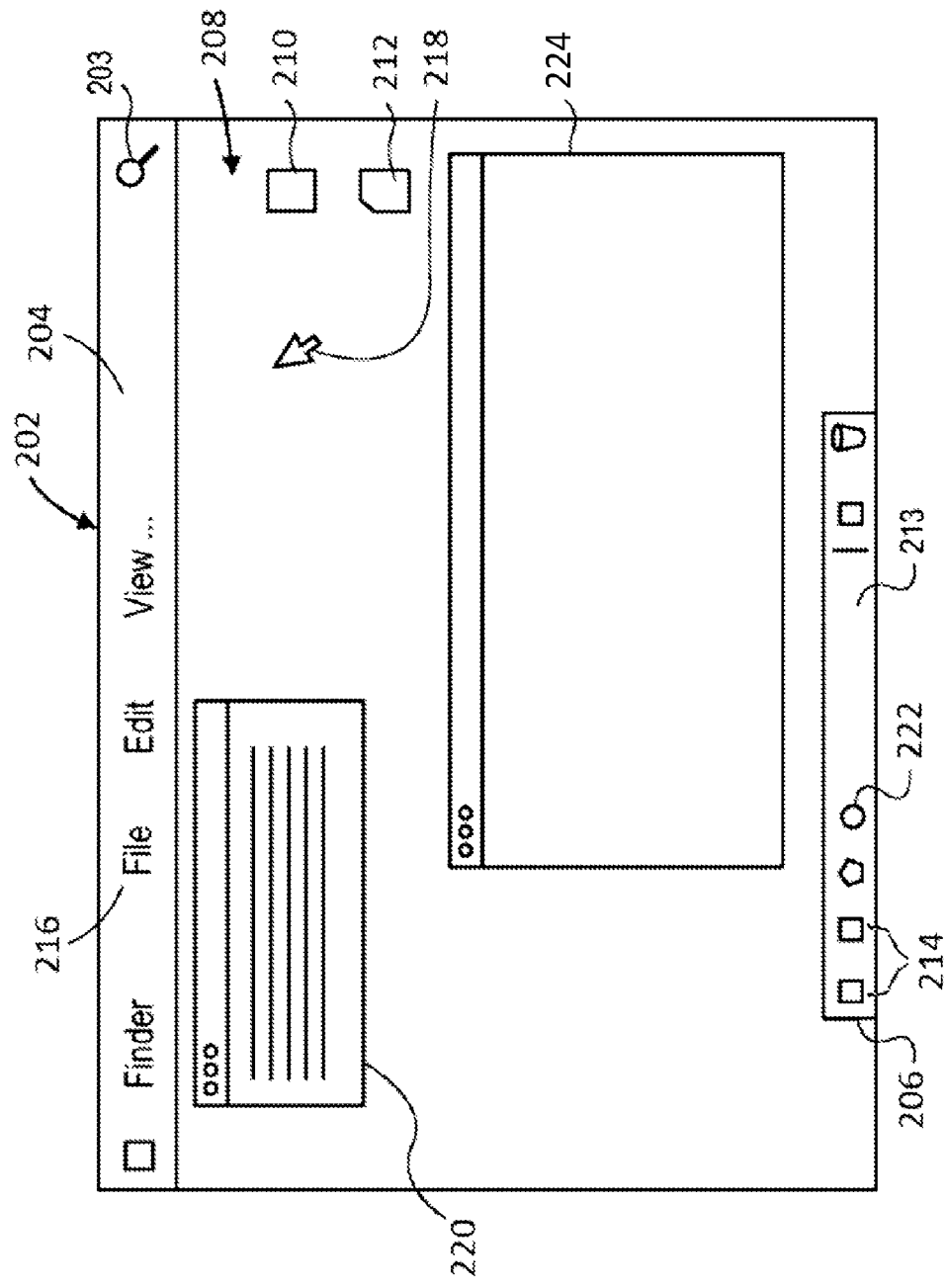
FIG. 2 shows an example user interface in which an energy meter can be provided.

FIG. 2 shows an example of a graphical user interface that appears on a screen of a display device in one embodiment of a method according to FIG. 1. The display screen 202, which can be a liquid crystal display (LCD) or other display device, presents a user interface that includes a desktop region on which is displayed a menu bar 204 positioned at an edge of the display screen 202, a dock 206 positioned at a different edge of the display screen 202, and a desktop 208 which can display one or more windows and icons on the desktop region. For example, in this example, the desktop 208 displays storage icon 210 and icon 212, wherein a storage icon 210 represents a folder wherein files may be stored and an icon 212 represents a file which a user has placed on the desktop 208. Further, the desktop 208 displays one or more windows generated by and associated with, in this case, two executing application programs as shown by the various icons 214 in the dock 206. The dock 206 is an example of a program control region that displays icons representing application programs that can be launched or otherwise controlled from dock 206. The dock 206 can be used to launch an application, quit an application, force quit an application, or to bring front most a window or all windows of an application.

In the example of FIG. 2, an application menu for a particular front most application (in this case, Finder) is shown as the application menu 216. The Finder is an example of a user interface program for a file management system in the Apple operating system (e.g., OS X) and is shown as the front most application by the name "Finder" in the menu bar 204. The selection of menu selectors (e.g., File, Edit, and View) in the application menu 216 may cause the display of a menu (not shown) for Finder. In this embodiment, a cursor 218 is displayed, which can be used by the user to interact with the graphical user interface. The cursor 218 can be controlled by any known cursor control device, such as a mouse or trackpad. In alternative embodiments, a touch screen, touch pad, or other touch sensitive surface (e.g., display screen with an integrated transparent touch panel) can be employed with or without a cursor to receive touch, and user interaction with the display screen 202 occurs through touches on the touch pad or touch screen (e.g., stylus or finger touch). As is known in the art, the cursor 218 can be moved around the display screen 202 to select windows, position text for entry, cause the display of menus from the menu bar 204 or to interact with the dock 206. In other embodiments, speech recognition may be employed to allow voice control of the graphical user interface to select windows, interact with the dock 206, cause the display of menus from the menu bar 204, etc.

In this example, the Finder application is currently displaying one window, Finder window 220. Although the displayed window 220 is a Finder window, it could also be a window of another application (e.g., Preview, a Web browser application, an email application, etc.) of a different front most application. In addition, one other application, an energy meter application represented by icon 222 in the dock 206 is also currently executing and causing the display of one or more windows on the desktop 208. While the Finder application is causing the display of window 220, the energy meter application is causing the display of energy meter window 224.

In this example, the energy meter window 224 presents an energy meter in a user interface that displays information representing energy utilization of applications. Batteries are increasingly becoming the key source of power for computing systems, especially for battery-operated mobile devices, which make energy efficiency an increasingly important factor in application development. Therefore, managing the energy performance of software applications is an important economic consideration in software engineering. With the energy efficiency of applications (e.g., mobile applications) becoming a more important concern for users, energy-optimization efforts of software developers targeting both the desktop and mobile platforms would benefit from using frameworks and instrumentation that help validate good designs and refine portions of application program logic that could be developed with increased energy efficiency.

From an application developer's point of view, one tactic for achieving energy-efficient software performance is effective handling of sleep-state transitions. A well-designed application should have little impact on overall energy consumption when it is open but idle. Idle applications should have negligible impact on energy use. For example, Appnap in OS X Mavericks, available from Apple, Inc., is an energy-saving function that idles applications that are not currently visible on a display screen. For example, a web browser might make large CPU demands while displaying high-resolution video in the browser but CPU demand drops significantly if a different application or window is opened to be displayed on top of the web browser. This can significantly increase energy efficiency and improve battery life. However, unlike other types of application optimization (e.g., operating system boot up time), developers often cannot visually see or infer symptoms of poor application energy performance. By providing developers with a way to analyze how applications consume energy (e.g., a tool to evaluate application energy consumption relative to performance) allows for development of applications with improved energy efficiency.

Figure 3:
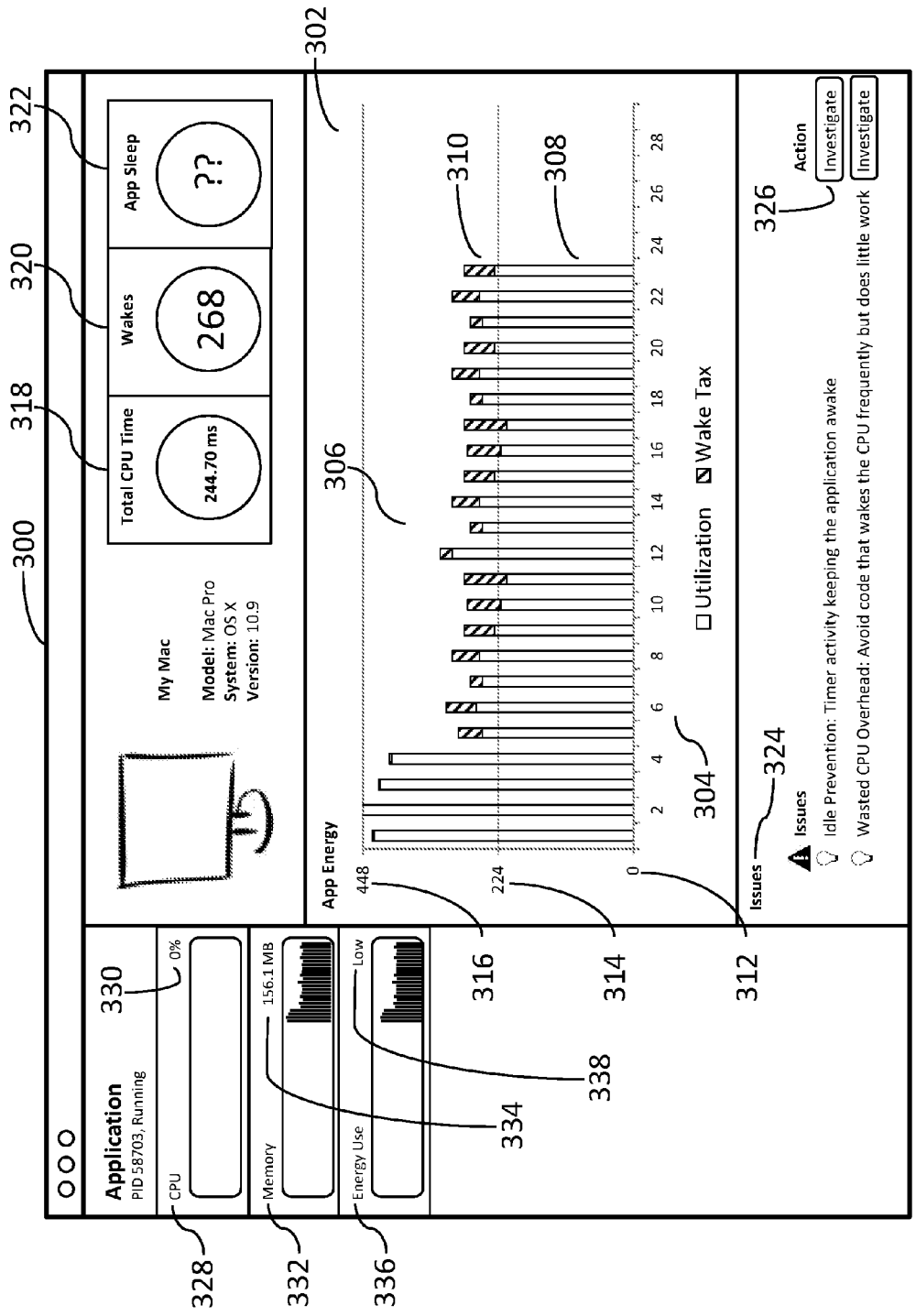
FIG. 3 shows an example embodiment of an energy meter user interface.

FIG. 3 shows an example embodiment of an energy meter user interface 300 that may be presented in energy meter window 224 to provide a software application developer an aid in designing for energy efficient performance. The energy meter user interface 300 provides an energy meter that uses derived information (e.g., power and time used to determine energy usage) that is not available through a traditional activity monitor. For example, energy usage of an application running in isolation, taking into account energy usage based on what the application is doing and not what the rest of the system is doing (e.g., shows CPU wakes in isolation of any other processes; for instance, not the number of times the CPU wakes, but instead shows number of times the application requests for the CPU to be woken). As used in this disclosure, the terms "wakes" or "CPU wakes" refers to instances when the CPU could have otherwise been powered down into an energy-saving state, if not for the application (e.g., the application sends a wake request and causes the CPU to be woken up). This precision provides a more accurate measurement of an application's energy utilization.

The energy meter user interface 300 displays an application energy impact section 302 that presents application energy usage data in real-time along a timeline 304 that presents a segment of application energy usage history as a series of energy bars 306. While an application is running and the user is using the application (e.g., while the energy meter application is in background), the timeline 304 can continue to update application energy usage data for display on the timeline 304. In this example, the timeline 304 displays an energy utilization metric that is banded (e.g., each of the series of energy bars 306 including at least one of a utilization portion 308 and a wake tax portion 310) with a low range 312, a medium range 314, and a high range 316 of total energy utilization.

The horizontal axis of the timeline 304 in the application energy impact section 302 represents time periods over which application energy usage is measured. The vertical axis of the timeline 304 in the application energy impact section 302 (e.g., height of the energy bars 306) represents a score of the application's energy utilization efficiency per unit time, with each energy bar representing total energy utilization during each particular time period. In this example, the application energy impact section 302 displays one second time increments between the energy bars 306; therefore, the height of each energy bar 306 represents a score of energy utilization efficiency per second. Each of a series of energy bars 306 is presented as an energy utilization metric that includes at least one of a utilization portion 308 and a wake tax portion 310, combined to represent total energy utilization (e.g., as indicated by the height of the energy bars 306). Total energy utilization is affected by multiple factors, including an amount of time spent on the CPU and a number of times the CPU is woken up, as well as in some examples the use of other monitored system resources (e.g., graphics processing unit (GPU)). The number of times the CPU is woken is combined, for each CPU wakeup, with a CPU wake tax (e.g., as represented by the wake tax portion 310).

In certain implementations, the number of times that the CPU is woken by the application is multiplied by a wake tax to convert it into CPU time. That amount (e.g., number of wakes*wake tax) is added to the actual amount of time that the application uses the CPU to yield total energy utilization. Therefore, total energy utilization may be provided by the following equation: Total Energy Utilization=Actual Time of CPU Usage+(Number of CPU Wakes*Wake Tax). Counters may be provided to display a real-time, running total of the total CPU time 318 and the total number of wakes 320 from a start of measurement using the energy meter. Further, an application sleep section 322 may be displayed to indicate a sleep state of the application (e.g., whether the application has been idled by Appnap).

The wake tax portion 310 represents overhead, when wake requests are sent to the CPU or when the CPU is awake, but is not performing processing operations (e.g., the CPU is awake, but does not need to be waking up that often). Each time the CPU wakes from idle, there is an incurred energy penalty. Every CPU wakeup, even for a trivial light job, requires energy to move between sleep states to full activity states and reduces time that the CPU stays in a deep energy-saving state. Applications should stay really idle when they meant to be idle, without waking idle processors unnecessarily or accessing system components (e.g., memory disks) at regular intervals unnecessarily. Therefore, frequent CPU wakes that do not fully utilize the CPU result in inefficient wakes, causing energy waste.

Wakes that add to the wake tax portion 310 include instances such as if a timer event of the application or an input event to the application (e.g. user input) causes the CPU to be woken, but does not request further CPU processing. For example, wakes include when the application needs to respond to a timer (e.g., alarm) and sends a signal to the CPU to wake. In contrast, wakes that do not add to the wake tax portion 310 include instances such as when other programs are called into the application and wake the CPU. As an example, if the user drags a window of an application around (e.g., repositions or resizes the window), the window server may be sending a large amount of traffic to the application that is not included in the wake tax portion 310, as this activity may not be directly controlled by the application. Even though the application may be receiving a large amount of events per second from the window server, this activity is not included in the wake tax portion because the act of moving the window of the application around is not actually waking a CPU when it is supposed to be asleep. The application's appropriate response (e.g., repositioning in response to the user's dragging) should not be penalized by showing within the wake tax portion 310. Rather, the wake tax portion 310 represents a penalty for when the application asks to keep the CPU awake, or requests for it to be woken, when it is not supposed to do so.

Thus, the wake tax portion 310 indicates to the user the presence of inefficient wakes and possible unnecessary waking of idle processors. At any given time, the take tax portion 310 of the energy utilization metric shows that inefficiency for a predetermined time measurement (a period of time that each of the energy bar 306 is associated with). If inefficient wake issues are identified as being present (e.g., large wake tax portion 310 relative to the utilization portion 308, indicating that the application is waking up or requesting CPU wakes to perform some task without actually doing anything), the user can launch a profiling instrument (not shown) that profiles the application to determine application behaviors that are causing inefficient wakes and wasting energy. After profiling, issues 324 may be displayed to indicate possible sources of application energy inefficiency that can be coded to become more energy efficient. For example, the profiling instrument can determine that "Idle Prevention" is caused by timer activity keeping the application awake and preventing proper idling. In another example, "Wasted CPU Overhead" is identified with the application containing code that wakes the CPU frequently, but does very little work.

Further, the user may provide input to take an investigate action 326 to further investigate each identified issue 324. For example, in the "Wasted CPU Overhead" issue, the investigate action 326 may provide details that the CPU wakes a certain number of times per unit time (e.g., a certain number of milliseconds) and appears as if the CPU was running the entire time, without actually spending any time in energy saving states. Therefore, in that example of waking the CPU too often (e.g., CPU wakes are high and CPU utilization is low), it would be more energy efficient for a software developer to consider batching work to utilize the CPU fully rather than cycling between states. In certain implementations, the investigate action 326 can display and identify a region of the application source code that may be contributing to higher energy consumption, or display suggestions to the user of actions that may be taken to reduce CPU wake requests.

The energy meter user interface 300 also displays a CPU usage history 328 that shows a dynamic range of where the application has been with regards to CPU usage and further displays a real-time CPU usage representation 330 of the percentage of the CPU's capacity (e.g., CPU time) that the application has used for a current time period. Further, the energy meter user interface 300 also displays a memory usage history 332 that shows a dynamic range of where the application has been with regards to memory usage and further displays a real-time memory usage representation 334 of the amount of memory used by the application for a current time period. Additionally, the energy meter user interface 300 displays an energy usage history 336 that shows a dynamic range of where the application has been with regards to energy usage and further displays a real-time textual representation 338 of the amount of energy that the application has consumed for a current time period (e.g., whether total energy utilization is proximate to a low range 312, a medium range 314, and a high range 316).

In one embodiment, the energy utilization metric in the energy meter application (e.g., energy bars 306 representing total energy utilization) is unit-less and displayed on a logarithmic scale. The user, such as a software developer, of the energy meter application would be concerned about addressable energy issues (e.g., inefficient wakes). That is, certain application operations necessarily utilize a large amount of CPU processing time and/or energy, of which the user has little control over, other than coding those operations to be performed in a more efficient manner. Energy savings may be better realized by identifying and eliminating application code that causes inefficient wakes, such as energy usage due to CPU wakes but do not actually perform any CPU processing. Even if each individual inefficient wake may be small relatively to overall energy utilized, the inefficiencies add up over long periods of time. Therefore, it would be beneficial to present such inefficient wakes to the user in a more prominent manner and not let the inefficiencies become hidden due to their small size. For example, when the energy utilization metric is not displayed on a logarithmic scale, any addressable issues due to inefficient wakes may not be visible during portions of time that an application uses a large amount of CPU processing power (e.g., the utilization portion 308 of the energy utilization metric is so large relative to the wake tax portion 310 such that the user would not be able to visually perceive the presence of the wake tax portion 310 when displayed in the energy meter user interface 300). The logarithmic scale allows the visualization of potential energy inefficiencies by exaggerating small contributions of inefficient wakes (e.g., as represented by the wake tax portion 310) and downplaying large contributions of actual CPU time (e.g., as represented by the utilization portion 308), and allows the locating of addressable energy usage issues. In alternative embodiments, the energy utilization metric may be associated with a user-designated unit of measurement and/or displayed in an arithmetic (linear) scale.

One of ordinary skill in the art will recognize that although the energy meter is described in the context of CPU usage and CPU wakes as being the basis for the displayed energy utilization metric, additional resource utilizations and metrics may be monitored in addition to and/or in place of CPU usage/wakes to determine an application's energy usage and efficiency. As one example, wireless transmitters such as radio signal transmitters are also large consumers of energy in computing systems, especially mobile devices, and may be a metric that serves as a basis for generating an energy utilization metric. Radio signal transmitters often stay active for ten seconds after waking, even if the transmitters are not actively transmitting data. Therefore, waking a radio signal transmitter to transmit a single byte of information consumes a similar amount of energy as transmitting data continuously for ten seconds. If a radio signal transmitter stays awake for ten seconds, but data transmission does not use the full ten seconds before the radio signal transmitter returns to a sleep state, there would be a radio signal tax associated with the inefficiency of having the transmitter awake but not transmitting data. Similarly, if the radio signal transmitter begins transmitting data but then stops for eight seconds before transmitting again, it is as if the transmitter was transmitting the entire time and there would be a radio signal tax associated with the inefficiency of failure to batch data transmissions into ten second increments.

Any measurable metric that the application requests of a computing system that consumes energy may serve as the basis for generating an energy utilization metric, as opposed to a user-requested feature (e.g., screen brightness, mouse cursor speed, or some other user setting or personalization aspects). Exemplary metrics that may serve as the basis for generating the energy utilization metric include, but is not limited to: storage access, radio signals, flash writes/reads, network access, or graphical processing unit (GPU) usage, etc. For graphics intensive applications, such as drawing applications, video playback applications, or image editing applications, GPU usage may be displayed as a separate bar to distinguish GPU energy inefficiencies from CPU energy inefficiencies.

Figure 4:
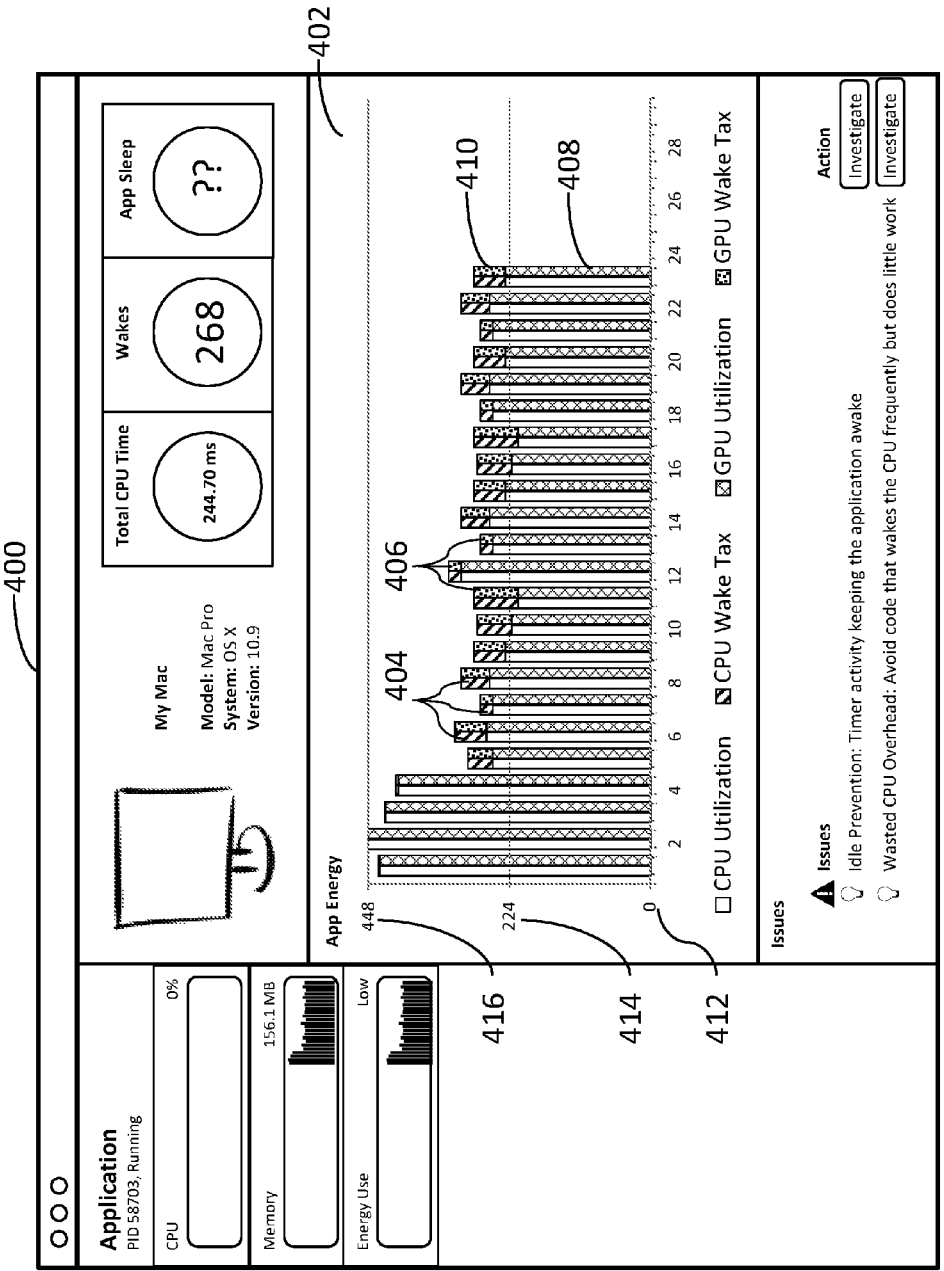
FIG. 4 shows an example embodiment of an energy meter user interface that displays energy utilization metrics positioned side-by-side for each measurement time period.

FIG. 4 shows an example embodiment of an energy meter user interface 400 that may be presented in energy meter window 224 that displays two bars, 404 and 406, for each time period in the application energy impact section 402. Bars 404 represent a CPU energy utilization metric and bars 406 represent a GPU energy utilization metric. In this example, the energy meter user interface 400 displays the energy utilization metrics as being banded (e.g., each of the bars 404 and 406 including at least one of a utilization portion 408 and a tax portion 410) with a low range 412, a medium range 414, and a high range 416 of total energy utilization. To avoid obscuring the figure, the additional user interface elements (e.g., total CPU time 318, total number of wakes 320, application sleep section 322, etc.) as shown in FIG. 3 are illustrated but not labeled in FIG. 4. Although not reproduced as being labeled, it should be understood that any previously discussed user interface elements are similarly presentable within energy meter user interface 400.

In this example, each of the bars 404 is presented as a CPU energy utilization metric representing total CPU energy utilization (e.g., as indicated by the height of the bars 404). As previously discussed, total CPU energy utilization is affected by multiple factors, including an amount of time spent on the CPU and a number of times the CPU is woken up. The number of times the CPU is woken is combined, for each CPU wakeup, with a CPU wake tax (e.g., as represented by the tax portion 410). Further, each of the bars 406 is presented as a GPU energy utilization metric representing total GPU energy utilization (e.g., as indicated by the height of the bars 406). Total GPU energy utilization may similarly be determined using the number of times the GPU is woken and combined for each GPU wakeup with a GPU wake tax.

Further, in accordance with the embodiment illustrated in FIG. 4 presenting the energy meter user interface 400 as having an energy utilization bar provided for each of the two metrics (e.g., CPU and GPU usage), one of ordinary skill in the art will recognize that in an alternative embodiment, a plurality of metrics may serve as the basis for generating energy utilization metrics. In the alternative embodiment, each of the plurality of metrics may be associated with their own separate energy utilization bars. In yet another embodiment, the plurality of metrics serve as the basis for generating a single energy utilization metric/bar that is representative of an overall inefficiency of energy usage (as opposed to usage and inefficiency of a single metric, such as CPU or GPU usage).

Figure 5:
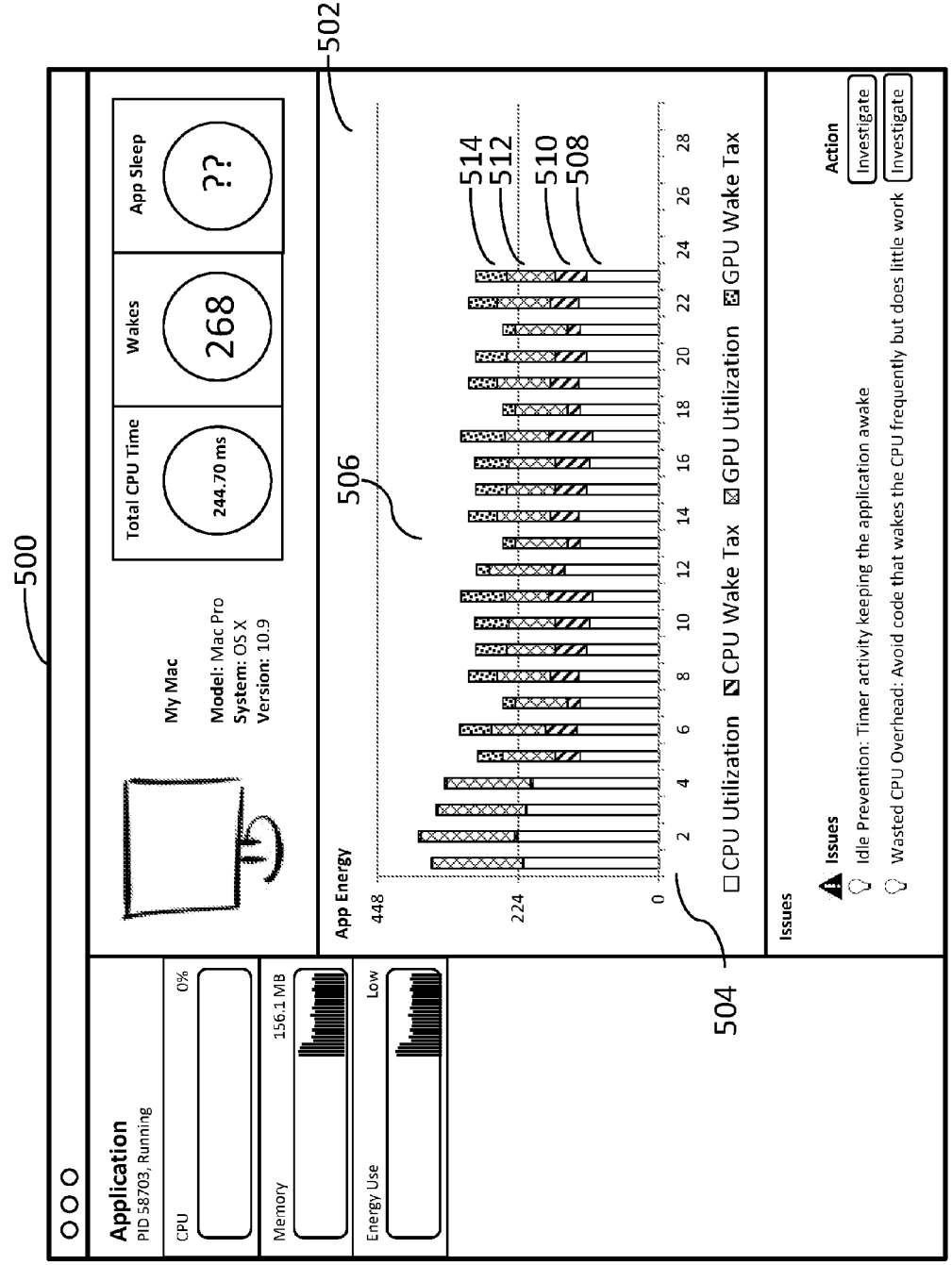
FIG. 5 shows an example embodiment of an energy meter user interface that displays energy utilization metrics stacked into a single bar for each measurement time period.

Referring now to FIG. 5, another example embodiment of an energy meter user interface 500 that may be presented in energy meter window 224 is shown. The energy meter user interface 500 displays an application energy impact section 502 that presents application energy usage data in real-time along a timeline 504 that presents a segment of application energy usage history as a series of energy bars 506. While an application is running and the user is using the application (e.g., while the energy meter application is in background), the timeline 504 can continue to update application energy usage data for display on the timeline 504. In this example, the timeline 504 displays an energy utilization metric that is banded (e.g., each of the series of energy bars 506 including at least one of a CPU utilization portion 508, a CPU wake tax portion 510, a GPU utilization portion 512, and a GPU wake tax portion 514). To avoid obscuring the figure, the additional user interface elements (e.g., total CPU time 318, total number of wakes 320, application sleep section 322, etc.) as shown in FIG. 3 are illustrated but not labeled in FIG. 5. Although not reproduced as being labeled, it should be understood that any previously discussed user interface elements are similarly presentable within energy meter user interface 500.

The horizontal axis of the timeline 504 in the application energy impact section 502 represents time periods over which application energy usage is measured. The vertical axis of the timeline 504 in the application energy impact section 502 (e.g., height of the energy bars 506) represents a score of the application's energy utilization efficiency per unit time, with each energy bar representing total energy utilization during each particular time period. In this example, the application energy impact section 502 displays one second time increments between the energy bars 506; therefore, the height of each energy bar 506 represents a score of energy utilization efficiency per second. Each of a series of energy bars 506 is presented as an energy utilization metric that includes at least one of a CPU utilization portion 508, a CPU wake tax portion 510, a GPU utilization portion 512, and a GPU wake tax portion 514, combined to represent total energy utilization (e.g., as indicated by the height of the energy bars 506).

Total energy utilization is affected by multiple factors, including an amount of time spent on the CPU/GPU and a number of times the CPU/GPU is woken up. The number of times the CPU/GPU is woken is combined, for each CPU/GPU wakeup, with a CPU/GPU wake tax (e.g., as represented by the wake tax portions 510 and 514). In certain implementations, the number of times that the CPU and GPU is woken by the application is multiplied by a wake tax to convert it into CPU and GPU time. That amount (e.g., number of wakes*wake tax) is added to the actual amount of time that the application uses the CPU and GPU to yield total energy utilization. Therefore, total energy utilization may be provided by the following equation: Total Energy Utilization=Actual Time of CPU Usage+Actual Time of GPU Usage+(Number of CPU Wakes*CPU Wake Tax)+ (Number of GPU Wakes*GPU Wake Tax).

Alternatively, the actual CPU and GPU usage may be combined into a single metric, while the wake tax portions remain displayed as separate bands in the energy bars 506. Further, in accordance with the embodiment illustrated in FIG. 5 presenting the energy meter user interface 500 as having an utilization portion and a wake tax portion provided for each of the two metrics (e.g., CPU and GPU usage) in the energy bars 506, one of ordinary skill in the art will recognize that in an alternative embodiment, a plurality of metrics may serve as the basis for generating energy utilization metrics. In the alternative embodiment, each of the plurality of metrics may be associated with their own separate utilization portions and wake tax portions in the energy bars 506. In yet another embodiment, the plurality of metrics serve as the basis for generating a single energy utilization metric/bar that is representative of an overall inefficiency of energy usage.

Figure 6:
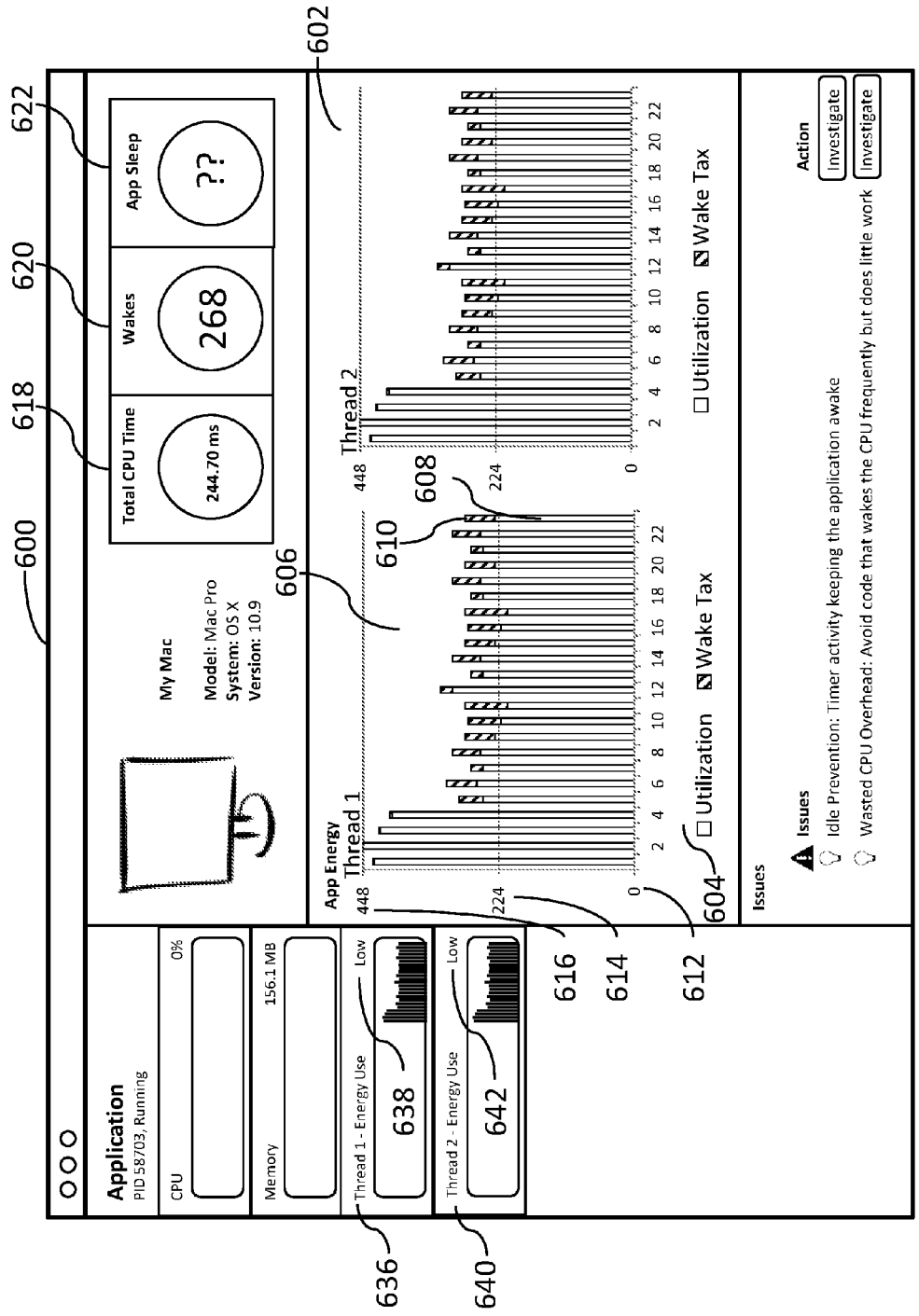
FIG. 6 shows an example embodiment of an energy meter user interface that presents energy utilization metrics for a plurality of CPU threads.

Referring now to FIG. 6, an example embodiment of an energy meter user interface 600 that may be presented in energy meter window 224 for analyzing an application using two or more CPUs for processing using parallel processing scheduling on multi-processor machines. For example, a software application executed on a Hexa-core processor creates three processes for fulfilling the user requirement. Each of these three processes creates two threads, enumerating a total of 6 working threads. Computation is distributed between the 6 independent threads. In such situations, the notion of total CPU time (e.g., as represented by total CPU time counter 618) is used, which is the sum of CPU time consumed by all of the CPUs utilized by the application. Elapsed real time is always same or more than CPU time for applications which use only one CPU for processing (e.g., examples illustrated in FIGS. 3-5); if no wait is involved for I/O or other resources, elapsed real time and CPU time are very similar. However, if an application uses parallel processing, total CPU time 618 for that application would be more than its elapsed real time. (Total CPU time)/(Number of CPUs) would be same as elapsed real time if work load is evenly distributed on each CPU and no wait is involved for I/O or other resources. In the Hexa-core processor example, if computation is distributed evenly between the threads and no wait for resources is involved, total CPU time is expected to be six times the elapsed real time.

The energy meter user interface 600 displays an application energy impact section 602 that presents application energy usage data in real-time along a timeline 604 that presents a segment of application energy usage history as a series of energy bars 606. While an application is running and the user is using the application (e.g., while the energy meter application is in background), the timeline 604 can continue to update application energy usage data for display on the timeline 604. In this example, the timeline 604 displays an energy utilization metric that is banded (e.g., each of the series of energy bars 606 including at least one of a utilization portion 608 and a wake tax portion 610) with a low range 612, a medium range 614, and a high range 616 of total energy utilization. Counters may be provided to display a real-time, running total of the total CPU time 618 and the total number of wakes 620 from a start of measurement using the energy meter across all CPUs used for processing. Further, an application sleep section 622 may be displayed to indicate a sleep state of the application (e.g., whether the application has been idled by Appnap).

In this example, the application energy impact section 602 presents the energy bars 606 as an energy utilization metric that includes at least one of a utilization portion 608 and a wake tax portion 610, combined to represent total energy utilization (e.g., as indicated by the height of the energy bars 606) for each of a plurality of CPU threads that the application is executed on. Although shown as executing across two threads, one of ordinary skill in the art will recognize that any number of CPU threads may be represented in the application energy impact section 602.

Further, the energy meter user interface 600 may displays an energy usage history for each of the plurality of CPU threads. In the example of FIG. 6, Thread 1's energy usage history 636 that shows a dynamic range of where Thread 1 has been with regards to energy usage and further displays a real-time textual representation 638 of the amount of energy that the application has consumed for a current time period on that thread (e.g., whether total energy utilization is proximate to a low range 612, a medium range 614, and a high range 616). Thread 2's energy usage history 640 that shows a dynamic range of where Thread 2 has been with regards to energy usage and further displays a real-time textual representation 642 of the amount of energy that the application has consumed for a current time period on that thread (e.g., whether total energy utilization is proximate to a low range 612, a medium range 614, and a high range 616).

Modules, Components and Logic

Certain embodiments are described herein as including logic or a number of components, modules, or mechanisms. Modules may constitute either software modules (e.g., code embodied on a machine-readable medium or in a transmission signal) or hardware modules. A hardware module is a tangible unit capable of performing certain operations and may be configured or arranged in a certain manner. In example embodiments, one or more computer systems (e.g., a standalone, client or server computer system) or one or more hardware modules of a computer system (e.g., a processor or a group of processors) may be configured by software (e.g., an application or application portion) as a hardware module that operates to perform certain operations as described herein.

In various embodiments, a hardware module may be implemented mechanically or electronically. For example, a hardware module may comprise dedicated circuitry or logic that is permanently configured (e.g., as a special-purpose processor, such as a field programmable gate array (FPGA) or an application-specific integrated circuit (ASIC)) to perform certain operations. A hardware module may also comprise programmable logic or circuitry (e.g., as encompassed within a general-purpose processor or other programmable processor) that is temporarily configured by software to perform certain operations. It will be appreciated that the decision to implement a hardware module mechanically, in dedicated and permanently configured circuitry, or in temporarily configured circuitry (e.g., configured by software) may be driven by cost and time considerations.

Accordingly, the term "hardware module" should be understood to encompass a tangible entity, be that an entity that is physically constructed, permanently configured (e.g., hardwired) or temporarily configured (e.g., programmed) to operate in a certain manner and/or to perform certain operations described herein. Considering embodiments in which hardware modules are temporarily configured (e.g., programmed), each of the hardware modules need not be configured or instantiated at any one instance in time. For example, where the hardware modules comprise a general-purpose processor configured using software, the general-purpose processor may be configured as respective different hardware modules at different times. Software may accordingly configure a processor, for example, to constitute a particular hardware module at one instance of time and to constitute a different hardware module at a different instance of time.

Hardware modules can provide information to, and receive information from, other hardware modules. Accordingly, the described hardware modules may be regarded as being communicatively coupled. Where multiple of such hardware modules exist contemporaneously, communications may be achieved through signal transmission (e.g., over appropriate circuits and buses) that connect the hardware modules. In embodiments in which multiple hardware modules are configured or instantiated at different times, communications between such hardware modules may be achieved, for example, through the storage and retrieval of information in memory structures to which the multiple hardware modules have access. For example, one hardware module may perform an operation and store the output of that operation in a memory device to which it is communicatively coupled. A further hardware module may then, at a later time, access the memory device to retrieve and process the stored output. Hardware modules may also initiate communications with input or output devices, and can operate on a resource (e.g., a collection of information).

The various operations of example methods described herein may be performed, at least partially, by one or more processors that are temporarily configured (e.g., by software) or permanently configured to perform the relevant operations. Whether temporarily or permanently configured, such processors may constitute processor-implemented modules that operate to perform one or more operations or functions. The modules referred to herein may, in some example embodiments, comprise processor-implemented modules.

Similarly, the methods described herein may be at least partially processor-implemented. For example, at least some of the operations of a method may be performed by one or processors or processor-implemented modules. The performance of certain of the operations may be distributed among the one or more processors, not only residing within a single machine, but deployed across a number of machines. In some example embodiments, the processor or processors may be located in a single location (e.g., within a home environment, an office environment or as a server farm), while in other embodiments the processors may be distributed across a number of locations.

The one or more processors may also operate to support performance of the relevant operations in a "cloud computing" environment or as a "software as a service" (SaaS). For example, at least some of the operations may be performed by a group of computers (as examples of machines including processors), with these operations being accessible via a network (e.g., the Internet) and via one or more appropriate interfaces (e.g., APIs).

Electronic Apparatus and System

Example embodiments may be implemented in digital electronic circuitry, or in computer hardware, firmware, software, or in combinations of them. Example embodiments may be implemented using a computer program product, for example, a computer program tangibly embodied in an information carrier, for example, in a machine-readable medium for execution by, or to control the operation of, data processing apparatus, for example, a programmable processor, a computer, or multiple computers.

A computer program can be written in any form of programming language, including compiled or interpreted languages, and it can be deployed in any form, including as a stand-alone program or as a module, subroutine, or other unit suitable for use in a computing environment. A computer program can be deployed to be executed on one computer or on multiple computers at one site or distributed across multiple sites and interconnected by a communication network.

In example embodiments, operations may be performed by one or more programmable processors executing a computer program to perform functions by operating on input data and generating output. Method operations can also be performed by, and apparatus of example embodiments may be implemented as, special purpose logic circuitry (e.g., a FPGA or an ASIC).

The computing system can include clients and servers. A client and server are generally remote from each other and typically interact through a communication network. The relationship of client and server arises by virtue of computer programs running on the respective computers and having a client-server relationship to each other. In embodiments deploying a programmable computing system, it will be appreciated that both hardware and software architectures require consideration. Specifically, it will be appreciated that the choice of whether to implement certain functionality in permanently configured hardware (e.g., an ASIC), in temporarily configured hardware (e.g., a combination of software and a programmable processor), or a combination of permanently and temporarily configured hardware may be a design choice. Below are set out hardware (e.g., machine) and software architectures that may be deployed, in various example embodiments.

Example Machine Architecture and Machine-Readable Medium

Figure 7:
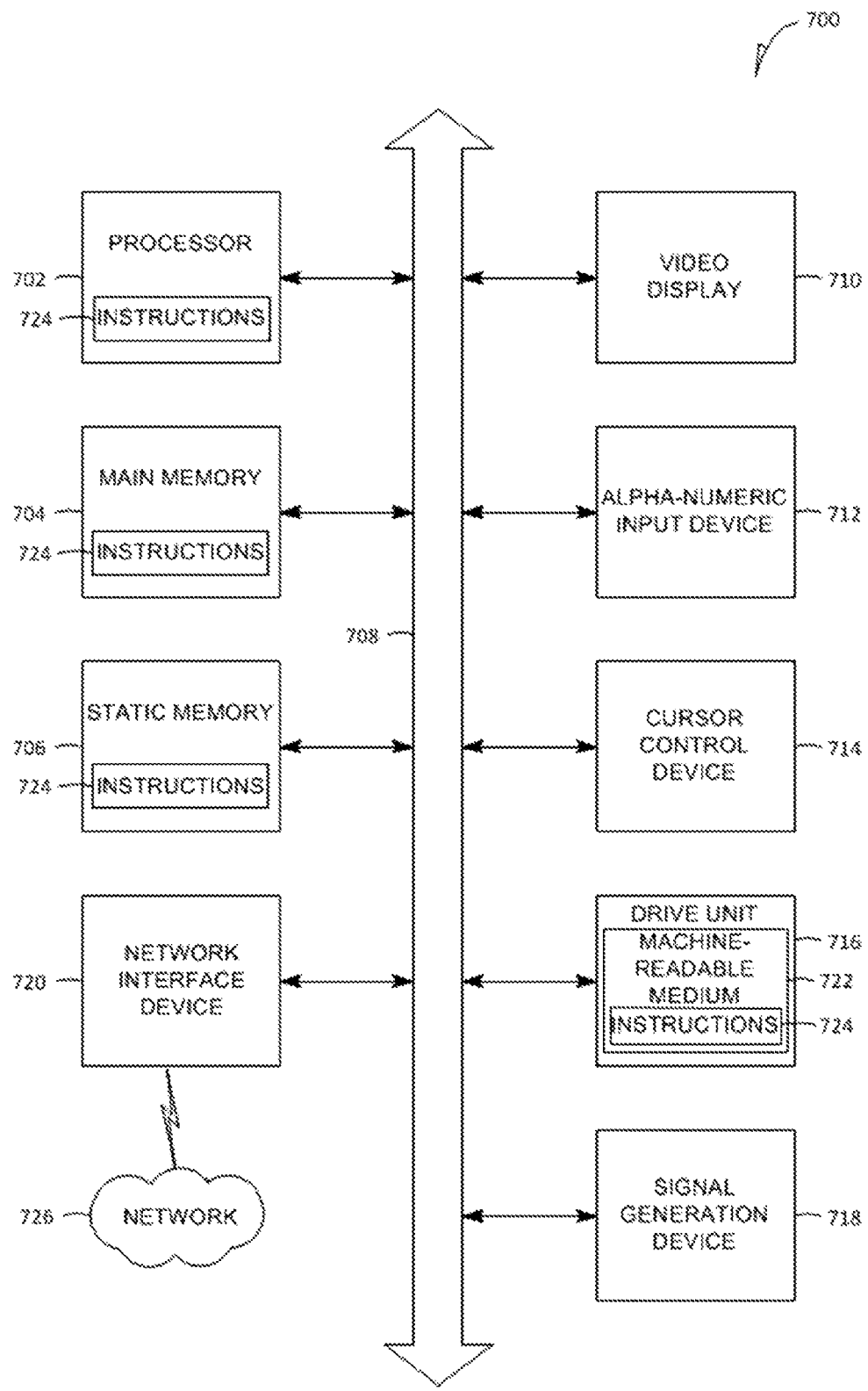
FIG. 7 is a diagrammatic representation of a machine in the example form of a computer system within which a set of instructions for causing the machine to perform any one or more of the methodologies discussed herein may be executed.

FIG. 7 is a block diagram of machine in the example form of a computer system 700 within which instructions, for causing the machine to perform any one or more of the methodologies discussed herein, may be executed. In alternative embodiments, the machine operates as a standalone device or may be connected (e.g., networked) to other machines. In a networked deployment, the machine may operate in the capacity of a server or a client machine in server-client network environment, or as a peer machine in a peer-to-peer (or distributed) network environment. The machine may be a personal computer (PC), a tablet PC, a set-top box (STB), a PDA, a cellular telephone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein.

The example computer system 700 includes a processor 702 (e.g., a central processing unit (CPU), a graphics processing unit (GPU) or both), a main memory 704 and a static memory 706, which communicate with each other via a bus 708. The computer system 700 may further include a video display unit 710 (e.g., a liquid crystal display (LCD) or a cathode ray tube (CRT)). The computer system 700 also includes an alphanumeric input device 712 (e.g., a keyboard), a user interface (UI) navigation device 714 (e.g., a mouse), a disk drive unit 716, a signal generation device 718 (e.g., a speaker) and a network interface device 720.

Machine-Readable Medium

The disk drive unit 716 includes a machine-readable medium 722 on which is stored one or more sets of instructions and data structures (e.g., software) 724 embodying or used by any one or more of the methodologies or functions described herein. The instructions 724 may also reside, completely or at least partially, within the main memory 704, static memory 706, and/or within the processor 702 during execution thereof by the computer system 700, the main memory 704 and the processor 702 also constituting machine-readable media.

While the machine-readable medium 722 is shown in an example embodiment to be a single medium, the term "machine-readable medium" may include a single medium or multiple media (e.g., a centralized or distributed database, and/or associated caches and servers) that store the one or more instructions or data structures. The term "machine-readable medium" shall also be taken to include any tangible medium that is capable of storing, encoding or carrying instructions for execution by the machine and that cause the machine to perform any one or more of the methodologies of the present invention, or that is capable of storing, encoding or carrying data structures used by or associated with such instructions. The term "machine-readable medium" shall accordingly be taken to include, but not be limited to, solid-state memories, and optical and magnetic media. Specific examples of machine-readable media include non-volatile memory, including by way of example, semiconductor memory devices (e.g., Erasable Programmable Read-Only Memory (EPROM), Electrically Erasable Programmable Read-Only Memory (EEPROM)) and flash memory devices; magnetic disks such as internal hard disks and removable disks; magneto-optical disks; and CD-ROM and DVD-ROM disks.

Transmission Medium

The instructions 724 may further be transmitted or received over a communications network 726 using a transmission medium. The instructions 724 may be transmitted using the network interface device 720 and any one of a number of well-known transfer protocols (e.g., HTTP). Examples of communication networks include a LAN, a WAN, the Internet, mobile telephone networks, Plain Old Telephone (POTS) networks, and wireless data networks (e.g., WiFi and WiMax networks). The term "transmission medium" shall be taken to include any intangible medium that is capable of storing, encoding or carrying instructions for execution by the machine, and includes digital or analog communications signals or other intangible media to facilitate communication of such software.

Although the present invention has been described with reference to specific example embodiments, it will be evident that various modifications and changes may be made to these embodiments without departing from the broader spirit and scope of the invention. Accordingly, the specification and drawings are to be regarded in an illustrative rather than a restrictive sense.

Although an embodiment has been described with reference to specific example embodiments, it will be evident that various modifications and changes may be made to these embodiments without departing from the broader spirit and scope of the invention. Accordingly, the specification and drawings are to be regarded in an illustrative rather than a restrictive sense. The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be used and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended; that is, a system, device, article, or process that includes elements in addition to those listed after such a term in a claim are still deemed to fall within the scope of that claim. Moreover, in the following claims, the terms "first," "second," and "third," and so forth are used merely as labels, and are not intended to impose numerical requirements on their objects.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

What is claimed is:

1. A method, comprising:
   generating a user interface including a display area to display an energy meter, wherein the energy meter represents energy utilization of an application;
   recording, over a time period, a number of wakes that the application requests to a central processing unit (CPU) as a wake count;
   generating an energy utilization metric representing the time period for the energy meter based on a CPU utilization metric and a wake tax, wherein the CPU utilization metric is calculated by measuring an actual amount of CPU usage by the application, and further wherein the wake tax is calculated by comparing time that the CPU is awake to the actual amount of CPU usage by the application;

displaying, in the user interface, the energy utilization metric, the wake count, and a total amount of time that the CPU is awake.

2. The method of claim 1, wherein the energy utilization metric is displayed in a logarithmic scale.

3. The method of claim 1, wherein the displaying the energy meter includes displaying separate energy utilization metrics for each of a plurality of processor cores of the CPU.

4. The method of claim 1, wherein the displaying the energy utilization metric includes displaying the energy utilization metric for each of a plurality of time periods that the application is running.

5. The method of claim 1, wherein generating the energy utilization metric further includes using an additional metric to represent energy utilization of the application, and further wherein the additional metric includes at least one of a radio signal transmitter usage, a GPU usage, a network access metric, and a storage access metric.

6. The method of claim 1, further comprising the operation of profiling the application using the energy meter to determine a portion of code resulting in a wake tax.

7. The method of claim 1, wherein the energy utilization metric is displayed as a banded bar within each of a plurality of time periods.

8. The method of claim 1, further comprising the operation of displaying a timeline that presents a segment of application energy usage history as a series of energy utilization metrics.

9. A non-transitory computer-readable medium storing instructions for execution by one or more processors, the instructions when executed by the one or more processors cause the one or more processors to perform operations including:
generating a user interface including a display area to display an energy meter, wherein the energy meter represents energy utilization of an application;
recording, over a time period, a number of wakes that the application requests to a central processing unit (CPU) as a wake count;
generating an energy utilization metric representing the time period for the energy meter based on a CPU utilization metric and a wake tax, wherein the CPU utilization metric is calculated by measuring an actual amount of CPU usage by the application, and further wherein the wake tax is calculated by comparing time that the CPU is awake to the actual amount of CPU usage by the application;
displaying, in the user interface, the energy utilization metric, the wake count, and a total amount of time that the CPU is awake.

10. The non-transitory computer-readable medium of claim 9, wherein the instructions that cause displaying, in the user interface, the energy utilization metric comprise instructions that cause displaying the energy utilization metric as a banded bar within each of a plurality of time periods.

11. The non-transitory computer-readable medium of claim 9, wherein the instructions that cause displaying, in the user interface, the energy utilization metric comprise instructions that cause displaying the energy utilization metric in a logarithmic scale.

12. The non-transitory computer-readable medium of claim 9, wherein the instructions that cause the generating a user interface including a display area to display an energy meter comprise instructions that cause displaying separate energy utilization metrics for each of a plurality of processor cores of the CPU.

13. The non-transitory computer-readable medium of claim 9, wherein the instructions that cause displaying, in the user interface, the energy utilization metric comprise instructions that causing displaying the energy utilization metric for each of a plurality of time periods that the application is running.

14. The non-transitory computer-readable medium of claim 9, wherein the energy utilization metric is generated using an additional metric to represent energy utilization of the application, and further wherein the additional metric includes at least one of a radio signal transmitter usage, a GPU usage, a network access metric, and a storage access metric.

15. The non-transitory computer-readable medium of claim 9, wherein the instructions that cause generating a user interface including a display area to display an energy meter further comprise instructions causing the display of a timeline that presents a segment of application energy usage history as a series of energy utilization metrics.

16. A system comprising:
at least one processor; and
a non-transitory computer-readable medium storing one or more sequences of instructions which, when executed by the at least one processor, causes:
generating a user interface including a display area to display an energy meter, wherein the energy meter represents energy utilization of an application;
recording, over a time period, a number of wakes that the application requests to a central processing unit (CPU) as a wake count;
generating an energy utilization metric representing the time period for the energy meter based on a CPU utilization metric and a wake tax, wherein the CPU utilization metric is calculated by measuring an actual amount of CPU usage by the application, and further wherein the wake tax is calculated by comparing time that the CPU is awake to the actual amount of CPU usage by the application;
displaying, in the user interface, the energy utilization metric, the wake count, and a total amount of time that the CPU is awake.

17. The system of claim 16, wherein the instructions that cause displaying, in the user interface, the energy utilization metric comprise instructions that cause displaying the energy utilization metric as a banded bar within each of a plurality of time periods.

18. The system of claim 16, wherein the instructions that cause displaying, in the user interface, the energy utilization metric comprise instructions that cause displaying the energy utilization metric in a logarithmic scale.

19. The system of claim 16, wherein the instructions that cause displaying, in the user interface, the energy utilization metric comprise instructions that causing displaying the energy utilization metric for each of a plurality of time periods that the application is running.

20. The system of claim 16, wherein the instructions that cause generating a user interface including a display area to display an energy meter further comprise instructions causing the display of a timeline that presents a segment of application energy usage history as a series of energy utilization metrics.

* * * * *